United States Patent
George

[19]

[11] Patent Number: 6,119,200
[45] Date of Patent: Sep. 12, 2000

[54] SYSTEM AND METHOD TO PROTECT SDRAM DATA DURING WARM RESETS

[75] Inventor: Geeta George, Fremont, Calif.

[73] Assignee: Mylex Corporation, Fremont, Calif.

[21] Appl. No.: 09/136,239

[22] Filed: Aug. 18, 1998

[51] Int. Cl.$^7$ .................................................. G06F 12/00
[52] U.S. Cl. ............................ 711/106; 711/166; 713/1
[58] Field of Search ................................ 711/106, 166; 713/1, 2; 365/222

[56] References Cited

U.S. PATENT DOCUMENTS

| 5,204,840 | 4/1993 | Mazur | 365/228 |
| 5,630,090 | 5/1997 | Keehn et al. | 711/106 |

FOREIGN PATENT DOCUMENTS

96/38788  12/1996  WIPO .

*Primary Examiner*—Reginald G. Bragdon
*Attorney, Agent, or Firm*—Flehr Hohbach Test Albritton & Herbert LLP

[57] ABSTRACT

A system and method in which a warm-reset request event is detected by reset hardware that subsequently blocks the warm reset request and places the SDRAM in a self-refresh mode in which the SDRAM data continually refreshes its stored data. Once the SDRAM is in the self-refresh mode the reset hardware resets the SDRAM's controller. Because the SDRAM is in the self-refresh mode when its controller is reset, none of the invalid signals on the controllers control lines will affect the stored data.

12 Claims, 2 Drawing Sheets

SYSTEM AND METHOD TO PROTECT SDRAM DATA DURING WARM RESETS

The present invention relates generally to warm reset data protection for volatile memories and, particularly, to warm reset data protection systems and methods for synchronous dynamic RAMs (SDRAMS).

BACKGROUND OF THE INVENTION

Synchronous Dynamic RAMs (SDRAMs) have become a popular type of dynamic memory due to their speed of operation and ease of use. SDRAMs are used in motherboards, embedded products such as RAID controllers, routers, Ethernet controllers and other systems that employ memory. Some of these products, such as RAID controllers, cannot afford to have their memory data corrupted upon the occurrence of resets. A reset can either be a cold reset, which is initiated by a power-on event, or a warm reset, which is initiated by software or a user from a panel switch.

Most external SDRAM memory controllers do not protect data stored in the memory from corruption during warm resets. A SDRAM memory controller that provides such protection is able to be reset internally while preventing data corruption of the SDRAMs it supports. In one prior art system reset hardware is used to detect a warm system reset. The hardware then triggers auto-refresh circuitry to set the SDRAM to an auto-refresh mode in which auto refresh cycles are initiated periodically throughout the entire period during which the warm reset is held active. Each auto-refresh cycles refreshes the data in the SDRAM so as to prevent its corruption. A disadvantage of this method is that the SDRAM has to be periodically refreshed by the external hardware while in auto refresh mode. The reset valid time (i.e., the duration of a reset operation) could be on the order of milliseconds and, as a result, several auto refresh cycles could be required to keep intact the SDRAM data.

Therefore, it would be desirable to provide a system and method for protecting SDRAM data during warm resets that does not require extensive intervention from the reset hardware.

SUMMARY OF THE INVENTION

The present invention is a system and method for protecting SDRAM data from corruption during warm resets.

More particularly, the present invention is a system and method in which a warm-reset request event is detected by reset hardware that subsequently blocks the warm reset request and places the SDRAM in a self-refresh mode in which the SDRAM data continually refreshes its stored data. Once the SDRAM is in the self-refresh mode the reset hardware resets the SDRAM's controller. Because the SDRAM is in the self-refresh mode when its controller is reset, none of the invalid signals on the controllers control lines will affect the stored data. Because it does not require the reset hardware to oversee multiple refresh cycles in which it issues auto-refresh signals, the present invention is simpler to implement than the prior art. Self-refresh mode is a standard feature of SDRAMS.

One system embodiment for use with an external SDRAM controller includes reset control and self-refresh control logic (RCSRCL) and power-on reset circuitry. In response to signals from the external SDRAM controller and the power-on reset circuitry and a combined reset signal (PRST) the RCSRCL generates SDRAM control signals for transitioning the SDRAM smoothly from normal mode to self-refresh mode during warm reset events and vice-versa. The signals from the power-on reset circuitry include a power-on reset signal (PWRRST) that is asserted by the power-on reset circuitry whenever a power-on, or cold, reset is performed. The signals from the external SDRAM controller include an auto-refresh signal that is asserted whenever the SDRAM controller initiates an auto-refresh operation. The combined reset signal PRST is asserted whenever a power-on reset or a warm reset is performed.

The RCSRCL knows a warm reset has been requested when the PRST signal is asserted while the PWRRST signal remains deasserted. Following a warm reset request the RCSRCL determines a safe time for placing the SDRAM in self-refresh mode. One possible safe time is indicated by the auto-refresh signal, which is asserted by the EMC when there is no SDRAM activity. Once it detects the auto-refresh signal the RCSRCL sends the self-refresh command to the SDRAM, placing the SDRAM in self-refresh mode, and then releases the warm reset to the EMC. Thus, by the time the EMC performs the warm reset the SDRAM is in self-reset mode, preventing corruption of the stored data.

In one embodiment, the SDRAM control signals used by the RCSRCL to give the self-refresh command include a row address strobe (RAS), a column address strobe (CAS), a write enable (WE) and a clock enable (CLKEN).

In one embodiment, the auto-refresh signal is a chip select signal that is not used by the SDRAM. As a result of employing the unused chip select line to carry the auto-refresh signal the load impedances of the actual control signals used by the SDRAM are not disturbed. This enables the SDRAM to achieve the speed for which the External Memory Controller (EMC) is designed.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
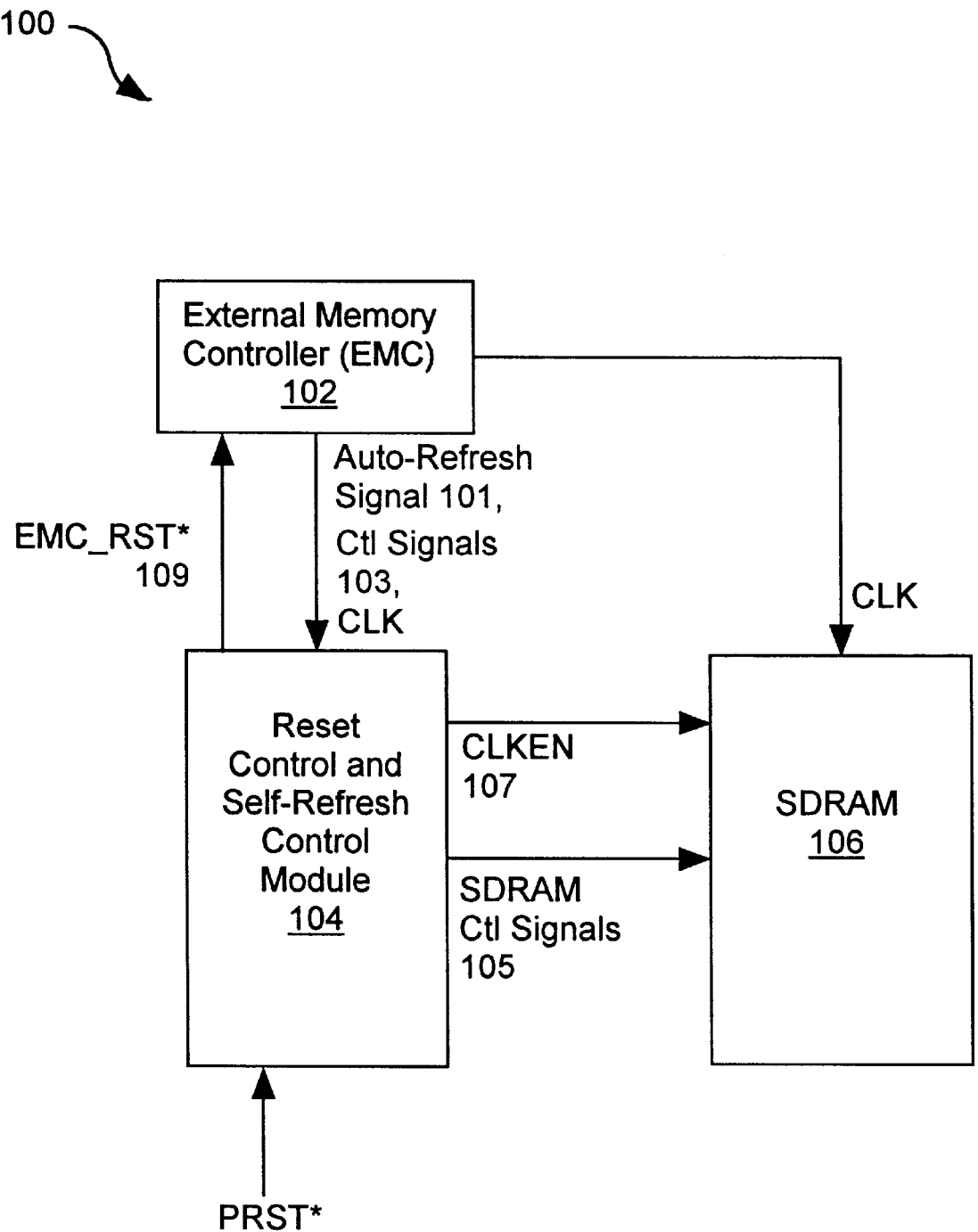
FIG. 1 is a block diagram of one embodiment.

Referring to FIG. 1, there is shown a block diagram of one embodiment of a SDRAM warm reset data protection circuit 100 that includes an external memory controller (EMC) 102 and a reset control and self-refresh control module (RCSRCM) 104. The external memory controller 102 provides the RCSRCM 104 with an auto-refresh signal 101, EMC control signals 103 and a clock CLK, which is also coupled to the SDRAM 106. The RCSRCM 104 controls the SDRAM 106 using a clock enable signal (CLKEN) 107 and conventional SDRAM control signals 105 (e.g., RAS, CAS, chip selects, write enable). The RCSRCM 104 resets the ECM 102 using a reset signal EMC_RST* 109 (herein, an asterisk "*" denotes an active low signal). The RCSRCM 104 receives a combined reset signal PRST* that is asserted by a microprocessor (not shown) when there is any type of system reset (a power-on reset, panel-switch reset, or software reset). The panel-switch and software resets are referred to as warm resets. The power-on reset is referred to as a cold reset.

A first task of the RCSRCM 104 is to separate warm reset requests from cold reset requests. Because SDRAM data corruption is not an issue during cold resets, the RCSRCM 104 simply passes all cold resets directly to the ECM 102. In contrast, the RCSRCM 104 withholds a warm reset to the EMC 102 until the RCSRCM 104 has placed the SDRAM 106 in a self-refresh mode in which the SDRAM refreshes itself without external intervention. Once it has placed the SDRAM in the self-refresh mode the RCSRCM 104 asserts the EMC_RST* signal, which resets the EMC 102. Because the SDRAM 106 is in self-refresh mode when the EMC 102 performs the warm reset the SDRAM data is protected from data corruption. Also, using the SDRAM self-refresh mode in this manner greatly simplifies the warm reset data protection circuit 100 as no external auto-refresh signals are required during the active reset period.

The RCSRCM 104 determines when a warm reset has been requested by first detecting power-on/cold reset events. Given that it knows when cold resets have been requested, the RCSRCM 104 is able to determine that a warm reset has occurred whenever an assertion of the PRST* signal is not accompanied by a request for a cold reset. Having determined when a warm reset has been requested the RCSRCM 104 determines when it is safe for the EMC 102 to be warm reset by monitoring the auto refresh signal 101 provided by the EMC 102. Each auto-refresh assertion indicates a safe time to transition the SDRAM 106 to the self-refresh mode because the EMC 102 will only assert the auto-refresh signal 101 for refresh and not for data operations (i.e., the EMC 102 will pulse the unused array chip select only for auto-refresh operations and not for any data accesses).

In the illustrated embodiment the auto-refresh signal 101 is provided by the EMC 102 on a redundant chip select line (i.e., a line whose associated chip select signal is not included in the SDRAM control signals 105). As a result of employing the unused chip select line to carry the auto-refresh signal the load impedances of the actual control signals 105 used by the SDRAM 106 are not disturbed. This enables the SDRAM 106 to achieve the speed for which the EMC 102 is designed. The auto-refresh signal 101 could also be provided on a control line used by the external memory controller 102 to control the SDRAM 106, but this approach would affect the load impedances of the SDRAM control signals. Additional details of the embodiment of FIG. 1 are now described in reference to FIG. 2.

Figure 2:
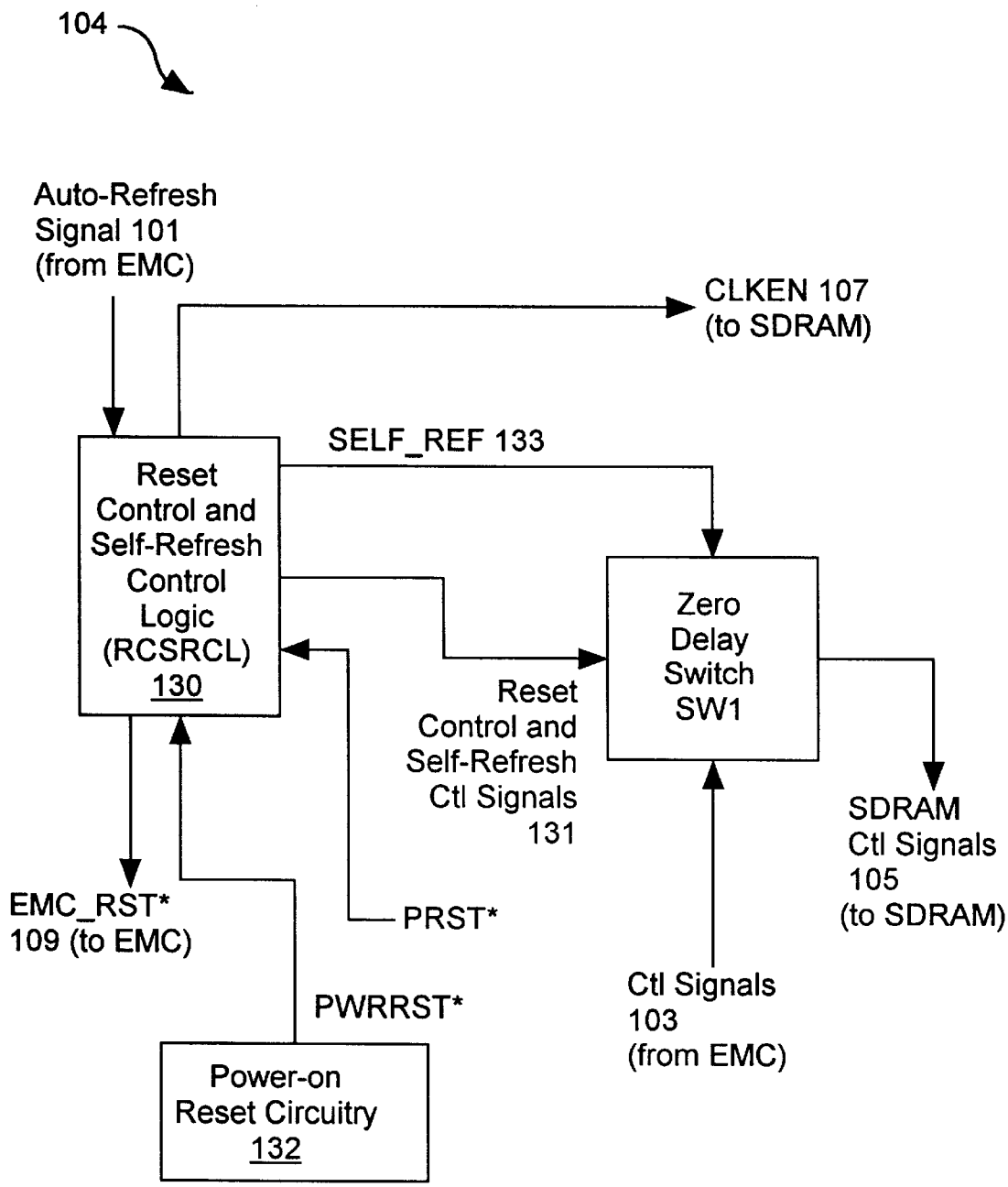
FIG. 2 is a block diagram of the reset control and self-refresh control module of FIG. 1.

Referring to FIG. 2, there is shown a block diagram of one embodiment of the RCSRCM 104 that includes reset control self-refresh control logic (RCSRCL) 130, power-on reset circuitry 132 and a zero delay switch SW1.

The RCSRCL 130 receives the auto-refresh signal 101 (FIG. 1), a power-on reset signal PWRRST* from the power-on reset circuitry 132 and the system reset signal PRST* (FIG. 1). The RCSRCL 130 outputs the CLKEN signal to the SDRAM 106, self-refresh mode (SELF_REF) and control signals 133, 131 to the switch SW1 and the EMC_RST* signal to the EMC 102. The self-refresh control signals 131 include the following:

| srCS* | self-refresh chip select; |
|---|---|
| srRAS* | self-refresh row address strobe; |
| srCAS* | self-refresh column address strobe; and |
| srWE* | self-refresh write enable for self-refresh mode. |

The switch SWI couples either the self-refresh control signals 131 or the EMC control signals 103 to the SDRAM control signals 105 depending on the state of the SELF_REF mode signal 133. The switch SW1 is a zero delay switch, meaning that its output changes almost immediately (i.e., asynchronously) following a change in its select signal (i.e., the SELF_REF signal). The EMC control signals 103 include:

| mcCS0* | chip select 0; |
|---|---|
| mcCS1* | chip select 1; |
| mcCS2* | chip select 2 (serves as the auto-refresh signal 101); |
| mcRAS* | row address strobe; |
| mcCAS* | column address strobe; and |
| mcWE* | write enable. |

In the illustrated embodiment the SDRAM control signals 105 include:

| CS0* | chip select 0; |
|---|---|
| CS1* | chip select 1; |
| CAS* | column address strobe; |
| RAS* | row address strobe; and |
| WE* | write enable. |

In normal mode, the switch SW1 couples the EMC signals mcCS0*, mcCS1*, mcRAS*, mcCAS* and mcWE* to the SDRAM control signals CS0*, CS1*, RAS*, CAS* and WE*. The only EMC signal 103 not output to the SDRAM 106 is the mcCS2* signal, which is used as the auto-refresh signal 101. In self-refresh mode, the switch SW1 couples the self-refresh signals srCS*, srRAS*, srCAS* and srWE* to the SDRAM control signals (CS0* or CS1*), CAS* and WE* signals, respectively.

The power-on reset circuitry 132 generates the PWRRST* signal whenever a cold reset is requested. The RCSRCL 130 passes this signal directly to the EMC 102 as the EMC_RST* signal (i.e., the RCSRCL passes all cold resets directly to the EMC). The RCSRCL 130 knows that a warm reset has been requested when the PRST* signal is asserted while the PWRRST* signal is deasserted. As described in reference to FIG. 1, when it identifies a warm reset request the RCSRCL 130 first determines a safe time for sending the self-refresh command to the SDRAM 106. In the embodiment of FIG. 2 the RCSRCL 130 does this by waiting for the EMC 102 to pulse the mcCS2 signal (array 2 chip select), which the EMC 102 only uses to indicate an auto-refresh cycle. After sampling the mcCS2 signal the RCSRCL 130 waits for a reset control period $T_{rc}$ and then sends the self refresh command by asserting (i.e., setting low) the srCS*, srRAS* and srCAS* signals and deasserting (i.e., setting high) the srWE* signal. In the embodiment of FIG. 2, which is based on requirements of the slowest SDRAM 106 in the market, the period $T_{rc}$ is 90 ns, equivalent to 7 RCSRCL clock cycles.

Before sending self refresh command, the RCSRCL 130 asserts the SELF_REF signal 133, which prepares the switch SW1 to pass the signals 131 from the RCSRCL 130 instead of the signals 103 from the EMC 102 to the memory 106. The RCSRCL 130 asserts the SELF_REF signal within the $T_{rc}$ period to ensure that the control switch SW1 is enabled before the self-refresh command is given. This avoids switch enable time for the self-refresh command and reduces to approximately 0 ns the delay for the commands passed through the switch SW1. Along with sending the self_refresh command, the RCSRCL 130 deasserts (sets low) the CLKEN signal, which places the memory in self refresh mode.

After giving the self-refresh command the RCSRCL 130 stops blocking the warm reset by passing the reset signal EMC_RST* to the EMC 102, which resets the EMC 102 to its initial state. During the resetting process invalid states will exist on the SDRAM control lines 103. These invalid states are irrelevant to the SDRAM 106, which is, at the same time, in self-refresh mode. At the end of an active warm reset, the RCSRCL 104 asserts the CLKEN signal 107 to transition the SDRAM 106 from self-refresh operation back to normal operation.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A system to protect data stored in SDRAM data during warm resets, comprising:

an external memory controller; and reset control hardware configured to detect a warm reset event and, following the warm reset event:

block a reset signal to the external memory controller;

place the SDRAM in a self-refresh mode in which the SDRAM refreshes its stored data; and release the reset signal to the external controller, enabling the external controller to be reset.

2. The system of claim 1, wherein the reset control hardware is configured to place the SDRAM in the self-refresh mode only when no SDRAM data operations would be affected.

3. The system of claim 2, wherein the reset control hardware is configured to determine when no SDRAM data operations would be affected by detecting assertion of an auto-refresh signal asserted by the external memory controller.

4. The system of claim 3, wherein the auto-refresh signal is a chip select signal generated by the external memory controller that is not used by the SDRAM.

5. The system of claim 1, wherein the reset control hardware comprises:

power-on reset circuitry that generates a power-on reset signal in response to a power-on reset event;

reset control and self-refresh control logic that receives an auto-refresh signal from the external memory controller, the power-on reset signal, and a combined reset signal generated in response to all types of reset events, the reset control and self-refresh control logic being configured to determine from the power-on reset signal and the combined reset signal when the warm reset event has occurred and, in response, to generate self-refresh control signals configured to place the SDRAM in the self-refresh mode; and a switch to couple the self-reset control signals to the SDRAM when it is safe to place the SDRAM in the self-refresh mode.

6. The system of claim 5, wherein the reset control and self-refresh control logic is further configured to receive an auto-refresh signal from the external memory controller that indicates when it is safe to place the SDRAM in the self-refresh mode.

7. The system of claim 6, wherein the auto-refresh signal is a chip select signal generated by the external memory controller that is not used by the SDRAM.

8. The system of claim 5, wherein the switch receives the self-reset control signals and memory control signals generated by the external memory controller and is configured to provide either the memory control signals or the self-refresh memory signal to the SDRAM based on state of a self-refresh select signal generated by the reset control and self-refresh control logic when it is safe to place the SDRAM in the self-refresh mode.

9. A method to protect data stored in SDRAM data during warm resets, comprising:

detecting a warm reset event; and following the warm reset event:

blocking a reset signal to an external memory controller that controls the SDRAM;

placing the SDRAM in a self-refresh mode in which the SDRAM refreshes its stored data; and releasing the reset signal to the external controller, enabling the external controller to be reset.

10. The method of claim 9, further comprising:

determining whether there are any SDRAM data operations; and performing the placing step only when there are no SDRAM data operations.

11. The method of claim 10, wherein the determining step comprises:

detecting assertion of an auto-refresh signal asserted by the external memory controller when there are no SDRAM data operations.

12. The method of claim 11, further comprising:

selecting for the auto-refresh signal a chip select signal generated by the external memory controller that is not used by the SDRAM.

\* \* \* \* \*